(12) United States Patent
Ishizuka et al.

(10) Patent No.: US 7,123,178 B2
(45) Date of Patent: Oct. 17, 2006

(54) DIGITAL ENCODER AND DIGITAL-TO-ANALOG CONVERTER USING SAME

(75) Inventors: Soichiro Ishizuka, Kanagawa (JP); Toru Ido, Kanagawa (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/170,908

(22) Filed: Jun. 29, 2005

(65) Prior Publication Data

US 2006/0007027 A1  Jan. 12, 2006

(30) Foreign Application Priority Data

Jun. 30, 2004  (JP) .............................. 2004-194984

(51) Int. Cl.
*H03M 1/66* (2006.01)
(52) U.S. Cl. ....................... 341/144; 341/143; 341/155
(58) Field of Classification Search ........ 341/143–145, 341/153–154
See application file for complete search history.

(56) References Cited

U.S. PATENT DOCUMENTS

| | | | | |
|---|---|---|---|---|
| 5,684,482 A | * | 11/1997 | Galton | ........................ 341/144 |
| 6,531,973 B1 | * | 3/2003 | Brooks et al. | .............. 341/143 |
| 6,535,155 B1 | * | 3/2003 | Ruha et al. | ................. 341/144 |
| 6,614,377 B1 | * | 9/2003 | Adams et al. | .............. 341/144 |
| 6,628,218 B1 | * | 9/2003 | Brooks et al. | .............. 341/143 |
| 6,771,199 B1 | * | 8/2004 | Brooks et al. | .............. 341/143 |
| 6,867,721 B1 | * | 3/2005 | Lin | ............................ 341/144 |

\* cited by examiner

*Primary Examiner*—Rexford Barnie
*Assistant Examiner*—Khai M. Nguyen
(74) *Attorney, Agent, or Firm*—William B Kempler; W. James Brady; Frederick J. Telecky, Jr.

(57) ABSTRACT

A digital encoder having a dynamic element matching (DEM) processor is divided into a master DEM circuit and N slave DEM circuits. The master DEM circuit encodes a multibit digital input signal (IN0) into parallel codes (C1) corresponding to the coefficient of a plurality of output nodes on the basis of a prescribed DEM algorithm. Each of the N slave DEM means (2) has 3 or more output nodes. Code (C1) from the master DEM circuit is encoded into parallel codes (C2) with the same weighting for each code and corresponding to the configuration of the 3 or more output nodes on the basis of a prescribed DEM algorithm, and the obtained parallel codes are output in parallel from 3 or more output nodes.

14 Claims, 6 Drawing Sheets

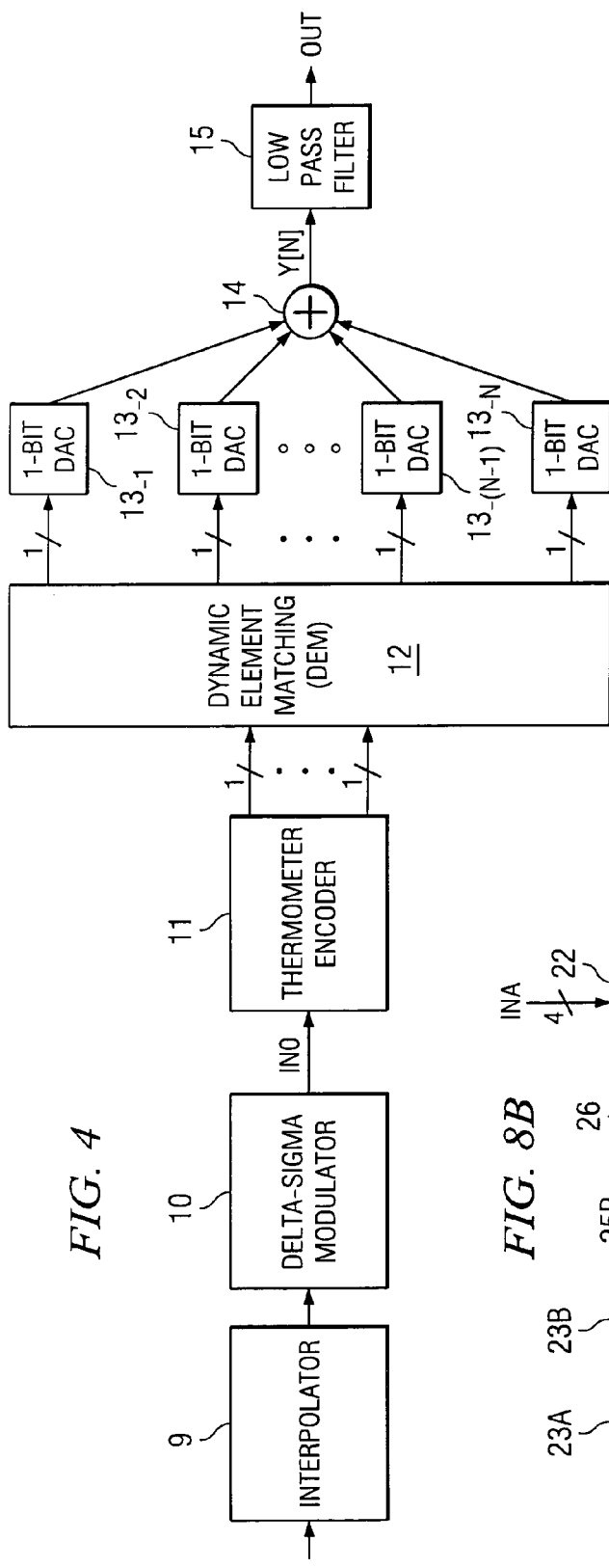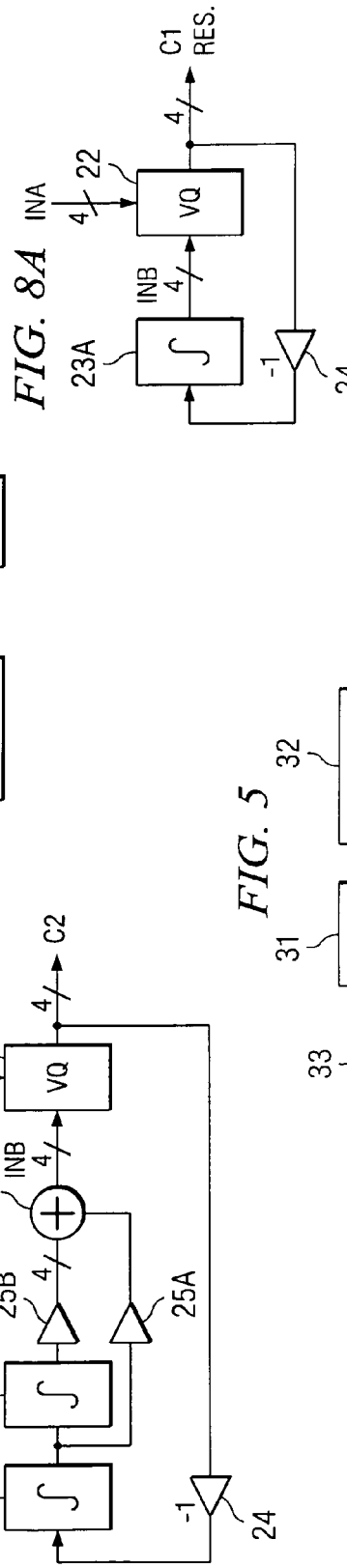

DIGITAL ENCODER AND DIGITAL-TO-ANALOG CONVERTER USING SAME

FIELD OF THE INVENTION

The present invention pertains to a digital encoder and a digital-to-analog converter therefor, wherein the digital encoder encodes a multibit digital input signal into parallel codes, which correspond to the configuration of a plurality of output nodes and have the same weighting for all of the codes, on the basis of a prescribed dynamic element matching algorithm.

BACKGROUND OF THE INVENTION

One method used to alleviate the problem of mismatch between elements is Dynamic Element Matching (hereinafter referred to as DEM). Here, "mismatch" means errors attributable to variations in the overall performance of the circuit through the use of one of a plurality of constituent circuit elements that have the same constitution but contain manufacturing errors, generated noise levels, and other differences.

DEM is a technology in which the element to be used at any time is determined randomly or by a prescribed algorithm, and the duty ratios of the various elements are averaged to reduce mismatch.

FIG. 9 is a diagram illustrating the constitution of a DEM circuit the prior art.

DEM part 100 is a digital encoder which performs the following operation, for example: digital input signal IN0 of binary weight is input, and M parallel outputs equal in number to the number of elements are output, to effect a conversion into a digital code column with the same weighting for the various codes. Elements 101-1, 102-2, . . . 102-M are sequentially coupled to the M output nodes of DEM part 100.

The number of the selected or operated elements defines the characteristics (such as the output signal level) at various times of the circuit containing said DEM constitution. Consequently, the number of codes that select or operate the elements in the code column output from DEM part 100 (hereinafter to be referred to as the active codes) is important.

When DEM is performed, for example, when the level of input signal IN0 lasts for a prescribed time, only a few elements in a certain region are selected and operated repeatedly. As a result, deviation of the duty ratio occurs, and this is a main cause of mismatch.

In DEM part 100, assignment of the elements that output the active codes is determined such that the duty ratio of the elements is averaged while the active code number needed at the various times is held. The mismatch error is therefore reduced, as is the mismatch itself.

In addition to the simple randomizing method, DEM mismatch can be reduced by storing the duty history of a certain range, and the active code is assigned preferably from those unused in said range.

The main method used to determine the DEM duty elements are primary mismatch reduction and secondary mismatch reduction constitutions. Here, the order represents the height of the level of the mismatch reducing function. For example, when the duty history is held as described above, the mismatch reduction performance is determined depending on how far back the stored duty history goes.

The secondary mismatch reduction constitution is very effective in suppressing noise. However, the secondary mismatch reduction constitution has the characteristic feature that the area increases dramatically as the number of elements increases. Consequently, when there are a large number of elements, the assembly area becomes larger, which is undesirable.

On the other hand, the primary mismatch reduction constitution allows assembly on a small area, but the performance is worse, and when there are elements with significant mismatch, the noise suppression performance is insufficient.

Consequently, the mismatch reduction method using DEM is a trade-off between the noise suppression performance and assembly area.

Consequently, it is difficult to improve the noise suppression performance while reducing the assembly area of the digital encoder with the DEM constitution shown in FIG. 9.

One purpose of the present invention is to propose a method that can increase the design freedom so as to relax the trade-off between assembly area and the noise suppression performance, and to improve the noise suppression performance while reducing the assembly area.

Another purpose of the present invention is to provide a digital-to-analog converter that can significantly reduce the error of the analog output signal and/or the assembly area by using said digital encoder.

SUMMARY OF THE INVENTION

An aspect of the present invention provides a digital encoder which comprises a master processing means that encodes a multibit digital input signal into prescribed parallel codes, and a plurality of slave processing means, each of which has 3 or more output nodes, encodes the codes output in parallel from said master processing means into parallel codes corresponding to the configuration of said 3 or more output nodes and with the same weighting for all of the codes on the basis of a prescribed dynamic element matching algorithm, and outputs said parallel codes in parallel from 3 or more output nodes.

Another aspect of the present invention also provides a digital-to-analog converter which comprises a digital encoder, which encodes the digital input signal into a code row with the same weighting for all of the codes and which outputs the codes in parallel from plural output nodes, and plural 1-bit digital-to-analog conversion parts into which the codes output in parallel from said digital encoder respectively are input; said digital encoder comprises a master processing means that encodes said input signal into parallel codes corresponding to the configuration of the plurality of output nodes on the basis of a prescribed dynamic element matching algorithm, and a plurality of slave processing means, each of which has 3 or more output nodes, encodes the codes output in parallel from said master processing means into parallel codes corresponding to the configuration of said 3 or more output nodes and with the same weighting for all of the codes on the basis of the prescribed dynamic element matching algorithm, and outputs said parallel codes in parallel from 3 or more output nodes into said plural 1-bit type digital-to-analog conversion parts.

According to yet another aspect of the present invention, said master processing means has an input conversion means, which computes the remainder code that indicates the remainder value indicating the remainder obtained when the value of said input signal is divided by N, the number of the slave processing means, and the multiple code that is commonly given to a plurality of slave processing means so as to enable representation of the multiple value of N, and which converts said input signal to said remainder code and said multiple code, and a master DEM means, which takes said remainder code output from said input conversion means as input, and which encodes said remainder code into parallel codes corresponding to the configuration of the plurality of output nodes on the basis of a prescribed dynamic element matching algorithm; and said slave processing means comprises a slave DEM means, which takes said multiple code output from said input conversion means and the parallel codes output from said master DEM means as inputs, and which performs encoding on the basis of the prescribed dynamic element matching algorithm.

According to a further aspect of the present invention, the number of said slave DEM means be chosen as a power of two.

In this case, said input conversion means may contain a means that performs bit shifting of said multiple code and outputs said multiple value of N.

According to a still further aspect of the invention, each input section of said slave processing means contain a means that performs bit shifting of said multiple code and outputs said multiple value of N.

BRIEF DESCRIPTION OF THE DRAWINGS

FIG. 4 is a block diagram illustrating the basic constitution of the $\Delta\Sigma$ type digital-to-analog converter in an embodiment of the present invention.

FIG. 5 is a block diagram illustrating the constitution of $\Delta\Sigma$ modulator part 10.

FIG. 8(A) is a diagram illustrating the basic constitution of the primary mismatch reduction constitution (master DEM means in this example).

FIG. 8(B) is a diagram illustrating the basic constitution of secondary mismatch reduction constitution (slave DEM means in this example).

REFERENCE NUMERALS AND SYMBOLS AS SHOWN IN THE DRAWINGS

In the figures, 1, 20 represent master DEM means, 2, 21 slave DEM means, 10 a $\Delta\Sigma$ modulator part, 11 a thermometer encoder, 12 a DEM processing means, 13-1 to 13-N 1 bit DAC, 14 an adder, 15 a low-pass filter, 22 a vector quantizer, 23A, 23B integrator, 24 a bit inverter, 25A, 25B coefficient amplifier, 26 an adder, IN0 an input signal, OUT an analog output signal, C1, C1res., C2, INA parallel codes, C0 a remainder code, and C1multiple a multiple code.

DESCRIPTION OF THE EMBODIMENTS

According to the present invention, it is possible to increase the design freedom so as to relax the trade-off between assembly area and noise suppression performance, and to improve the noise suppression performance while reducing the assembly area.

Also, it is possible to provide a digital-to-analog converter that can significantly reduce the errors in the analog output signal and/or the assembly area by using said digital encoder.

Figure 1:
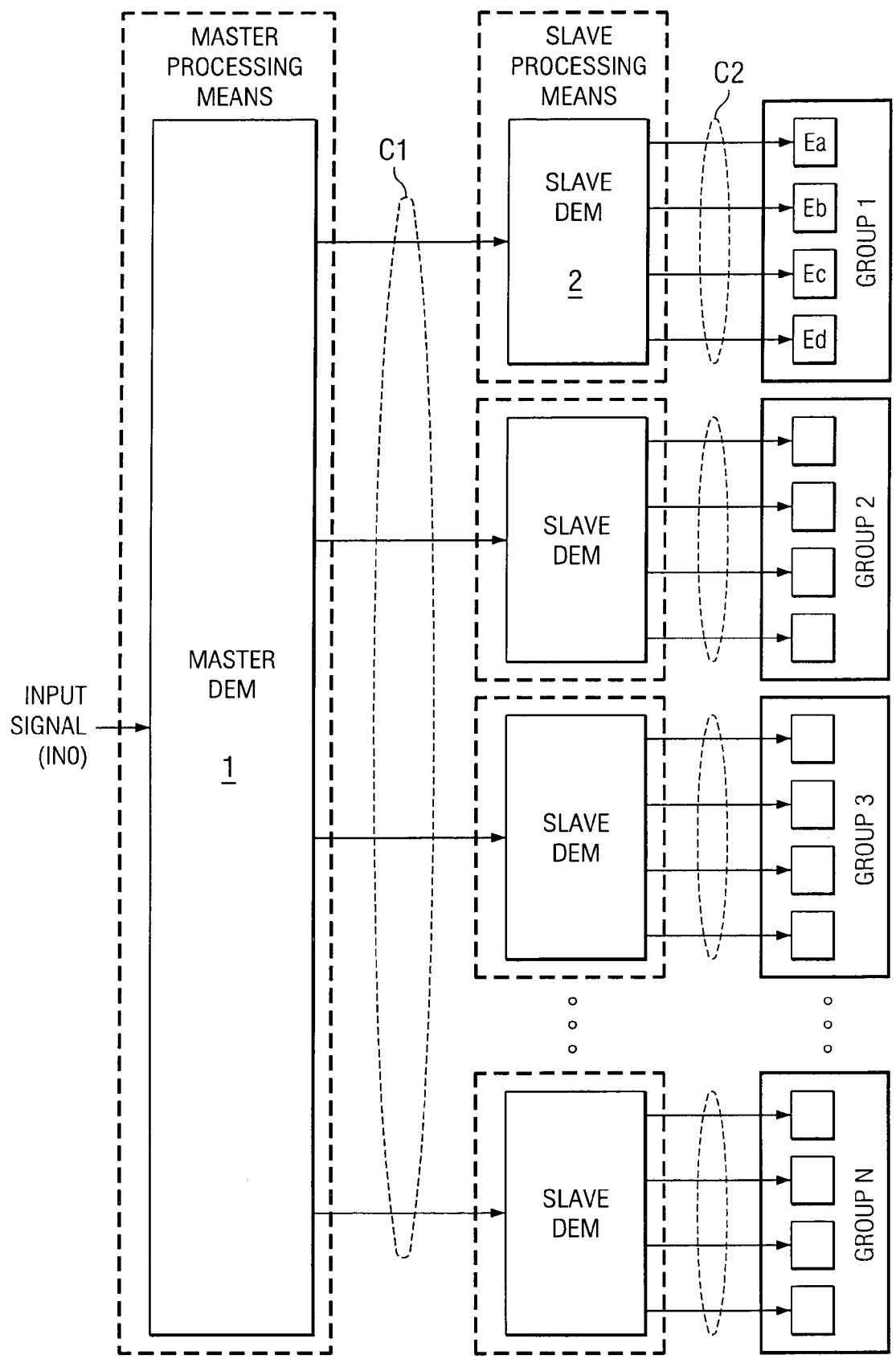
FIG. 1 is a block diagram illustrating the digital encoder in an embodiment of the present invention.

FIG. 1 is a block diagram illustrating the digital encoder of the present invention.

According to the present invention, the elements are divided into N groups, and in each group, the mismatch reduction method using DEM is applied.

More specifically, the same number of blocks (slave processing means) with DEM applied are arranged as the number N of groups of elements. FIG. 1 is a diagram illustrating the constitution in which each slave processing means is made up of slave DEM means 2.

Each slave DEM means 2 has three or more output nodes (four output nodes in this example). The output nodes are coupled to elements Ea–Ed in the corresponding group. Consequently, the number of elements in each group is the same as the number of output nodes of each slave DEM means 2, that is, 4 in this example.

For each slave DEM means 2, the input signal (part of parallel code C1) is encoded into parallel codes C2 assigned to the parallel output nodes by means of the DEM scheme. Consequently, even if the number of elements in the rear section that are made active corresponding to input parallel codes C1 is the same, the combination of elements actively actuated for use varies dynamically.

In the former section of slave DEM means 2, a common one block (master processing means) is set. The master processing means has master DEM means 1 for which the mismatch reduction method using DEM is adopted.

Master DEM means 1 encodes multibit digital signal IN0 into parallel codes C1 assigned to four slave DEM means 2 with the DEM method intrinsic to the master processing means. Consequently, even if the number of slave DEM means 2 is the same corresponding to input signal IN0, there is a dynamic variation in the combination of slave DEM means 2 actually selected at any time.

Also, number of groups N shown in FIG. 1 is any integer greater than or equal to 2. The number of elements in each group is not limited to 4. It may be any integer greater than or equal to 3.

In this embodiment, with the aforementioned constitution, by means of the secondary mismatch reduction constitution in both master DEM means 1 and slave DEM means 2, it is possible to reduce the assembly area and to improve the DEM performance.

In FIG. 8, where the conventional secondary mismatch reduction constitution is used, if the number of the elements coupled to the latter section is "M" and the proportionality constant is "A," then the assembly area $S_{normal}$ can be approximated by Equation 1 below.

[Equation 1]

$$S_{normal} = A \times M^2 \quad (1)$$

On the other hand, in the embodiment shown in FIG. 1, when the elements are divided into N groups, the number of elements in each group is (M/N), and the assembly area $S_{cascaded}$ of the cascaded DEM constitution becomes Equation 2 below.

[Equation 2] (2)

$$S_{cascaded} = (N+1) \times A(M/N)^2$$
$$= [(N+1)/N^2] \times AM^2$$

The DEM performance (noise suppression performance) $P_{normal}$ of the conventional secondary mismatch reduction constitution alone is proportional to the mismatch rate "X" of the element, and reciprocally proportional to saving coefficient "B" and oversampling ratio "O," respectively. Consequently, it can be represented by Equation 3 below.

[Equation 3] (3)

$$P_{normal} = 1 \bigg/ \left(\frac{X}{BO}M\right)$$

Here, coefficient "B" decreases as the order of DEM becomes higher. Also, the higher the oversampling ratio "O," the higher the speed of averaging of the duty ratio of the elements. Consequently, this factor can be included as oversampling ratio "O" in the equation.

On the other hand, as shown in FIG. 1, the DEM performance $P_{cascaded}$ of the cascaded DEM constitution in this embodiment is represented by Equation 4.

[Equation 4] (4)

$$P_{cascaded} = 1 \bigg/ \left(\frac{X}{BO}\left(\frac{M}{N} + N\sqrt{\frac{N}{M}}\right)\right)$$

Figure 2:
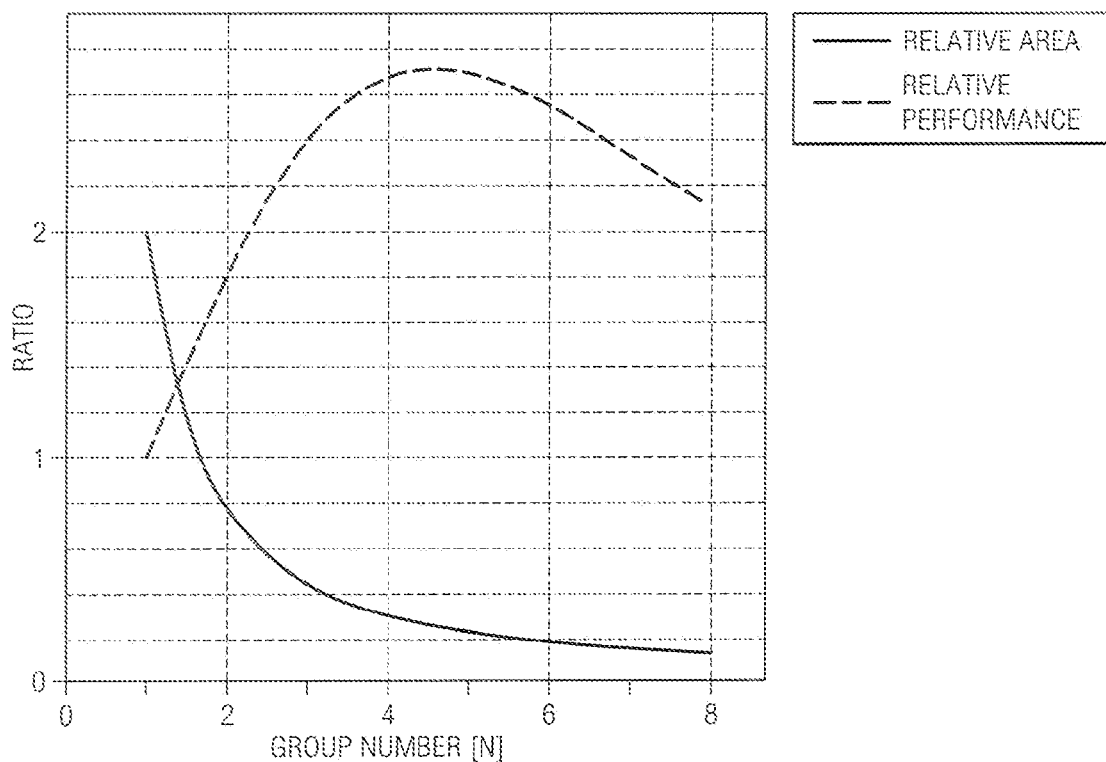
FIG. 2 is a graph illustrating the relationship between the element group number and the assembly area ratio as well as the DEM performance ratio when the element number is 16.
Figure 9:
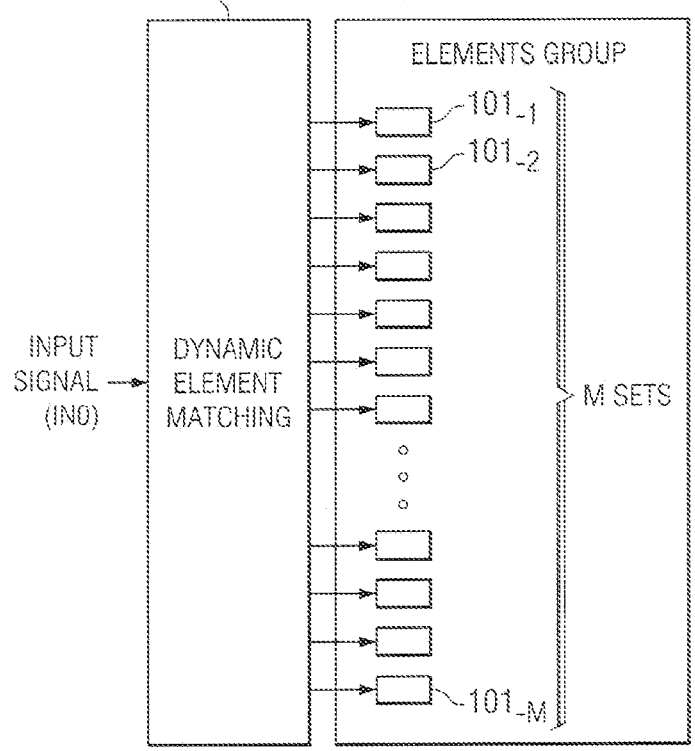
FIG. 9 is a block diagram illustrating the DEM constitution in the prior art.

FIG. 2 is a graph illustrating the relationship between element group number N and assembly area ratio as well as DEM performance (represented as "Ratio" in the figure), when the element number M is 16. For this graph, the ordinate represents "Ratio," and, when the assembly area $S_{normal}$ or DEM performance $P_{normal}$ in the case of the conventional secondary DEM constitution only is taken as one, it shows the relative value of assembly area $S_{cascaded}$ or DEM performance $P_{cascaded}$ of the cascaded DEM constitution in this embodiment.

As can be seen from this graph, when the present invention is applied to the case in which the element number M is 16, it is possible to realize DEM performance better than that of the conventional type and with group number of 2 or more on a smaller assembly area.

Also, since element group number N is increased, the output node number (the number of elements coupled to the output) of the secondary slave DEM decreases correspondingly, and the assembly area of the secondary slave DEM gradually decreases. In addition, the internal constitution of DEM, such as the comparator and the circuit for holding the history information, etc., will be explained further below.

On the other hand, there is an optimum value for the DEM performance. In the case shown in the figure, the DEM performance is the optimal near N=4 where the element group number N and the number of elements corresponding to each secondary slave DEM are balanced. By changing the element number M and the constitution of DEM, it is also possible to change this trend. Also, depending on the state of variation in the mismatch as an error factor, the degree of variation in the graph shown in FIG. 2 also changes. Consequently, although this is not a rule for all the cases, generally speaking, when the performance with respect to the assembly area is to be good, it is preferred that element group number N and the number of elements corresponding to one slave DEM be balanced.

Figure 3:
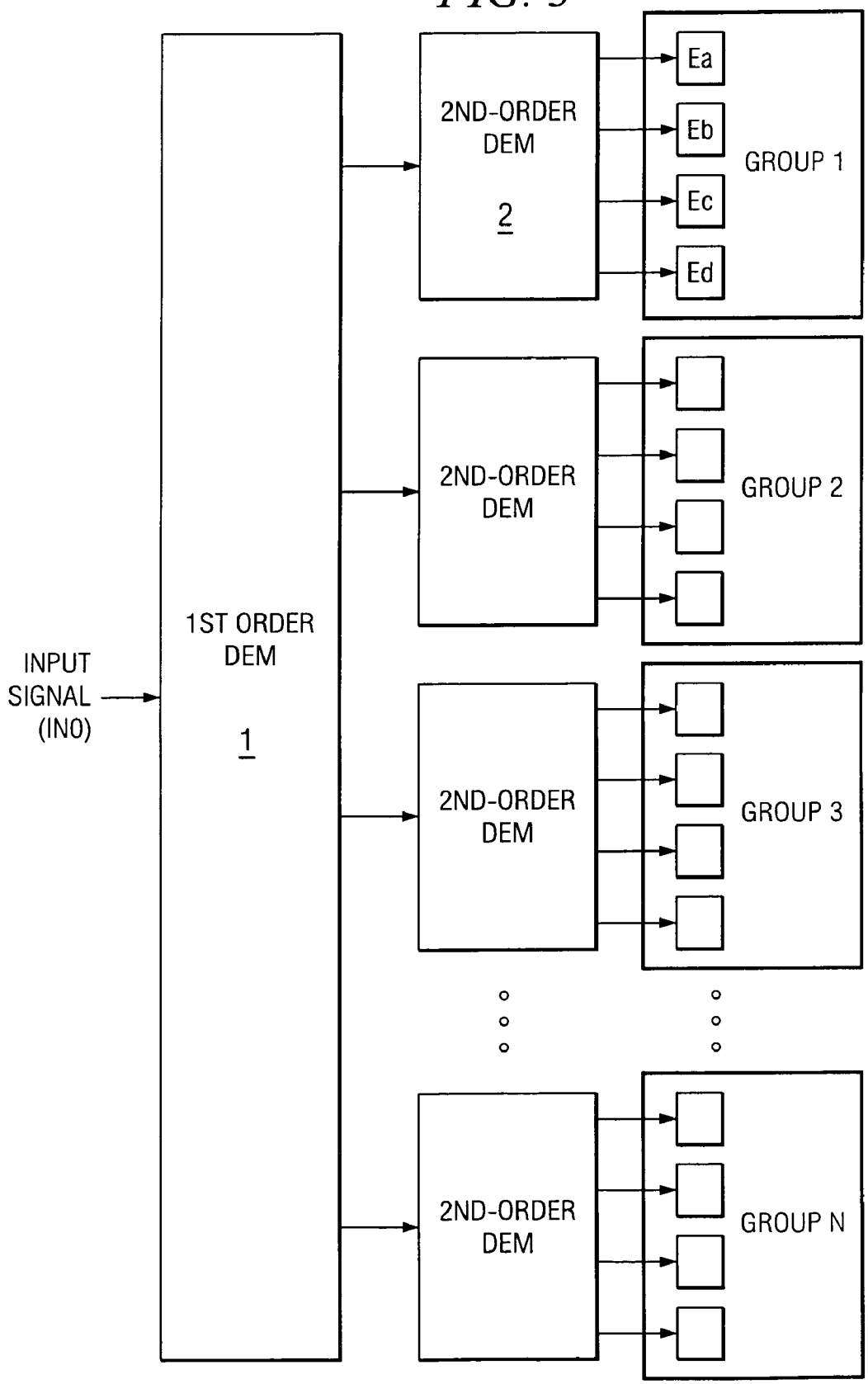
FIG. 3 is a block diagram illustrating the case when the master DEM is changed to the primary mismatch reduction constitution while the order of the slave DEM remains second order.

FIG. 3 is a diagram illustrating the case when the master DEM is changed to the primary mismatch reduction constitution while the order of the slave DEM remains second order.

In this case, compared with the case shown in FIG. 1 when the secondary mismatch reduction constitution is adopted as the master DEM, although there is slight degradation of DEM performance, the assembly area nevertheless can be further reduced. Also, FIG. 3 shows an example of the modified scheme, and this embodiment allows for a change in the order of the slave side and the master side as desired.

Consequently, in this embodiment, one can change the constitution as desired depending on the preference for either the mismatch reduction function (DEM performance) or the assembly area.

When the mismatch reduction function is preferred over the assembly area, as shown in FIG. 3, it is possible to adopt a lower order for the mismatch reduction constitution on the master side or slave side. On the other hand, when the reduction of the assembly area is preferred over an improvement in DEM performance, one may change the mismatch reduction constitution to a higher order. In this case, it is also possible to adopt a $3^{rd}$ or higher order mismatch reduction constitution. Because the assembly area for each DEM constitution may become excessively large in this scheme, it is necessary to take measures to suppress an increase in the assembly area.

One of the measures that may be adopted in this case is to increase the element group number, that is, the slave DEM number, so as to reduce the number of elements handled by each slave DEM. This scheme may contribute to a reduction in the assembly area in some cases. On the other hand, for the various elements with slave DEM coupled to the output node, the average cycle time of processing for dynamic element matching becomes shorter, and the DEM efficiency increases. In this sense, said scheme also contributes to improved performance. How this scheme contributes to reduced area and improved performance depends on other factors, such as the order of the DEM constitution, the specific circuit constitution, etc.

As explained above, in this embodiment, by dividing the DEM constitution into a master side and slave side, greater flexibility is available in terms of the balance between DEM performance and assembly area depending on the design requirements. As a result, realization of the optimum design becomes easier. In other words, by optimizing the element group number (slave DEM number) and the order for the mismatch reduction constitution on the master side and slave side, it is possible to select any desired balance point continuously in consideration of the tradeoff between the DEM performance and assembly area, and it is possible to realize the performance and area of the constitution desired by the designer.

A more concrete example of the assembly in which a digital encoder with the cascaded DEM constitution is assembled in a $\Delta\Sigma$ type digital-to-analog converter will be explained below. Here, in the cascaded DEM constitution, the master side is the primary side and the slave side is the secondary side. However, the present invention is not limited to this constitution. Also, the scheme of assembly of the cascaded DEM constitution is not limited to the ΔΣ type digital-to-analog converter to be explained below. One may also adopt various other types of digital-to-analog converters, including a plurality of 1-bit type digital-to-analog conversion parts having the same weighting, in the present invention.

Figure 6A:
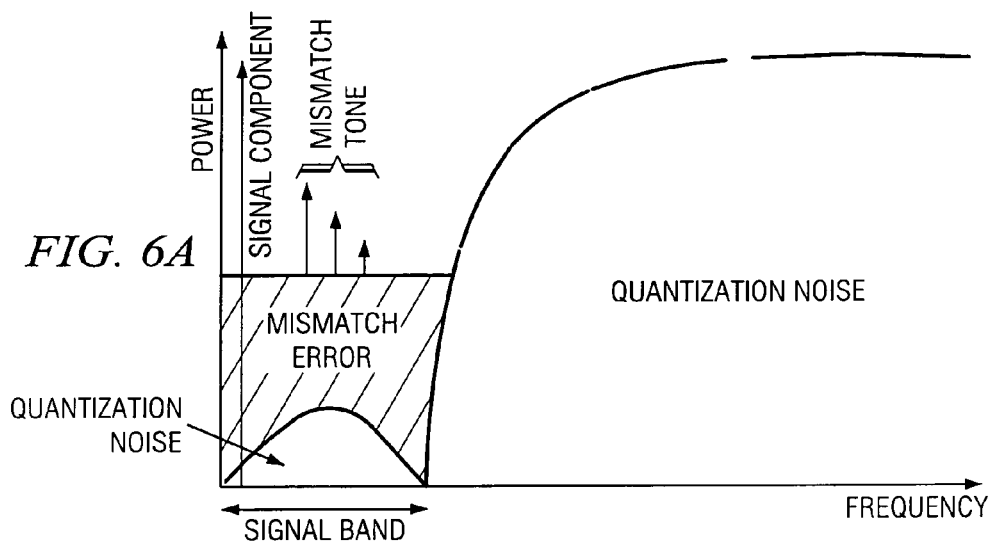
FIGS. 6(A)–(C) are graphs schematically illustrating the state of the suppression of noise. The abscissa represents frequency, and the ordinate represents the signal or noise power.
Figure 6B:
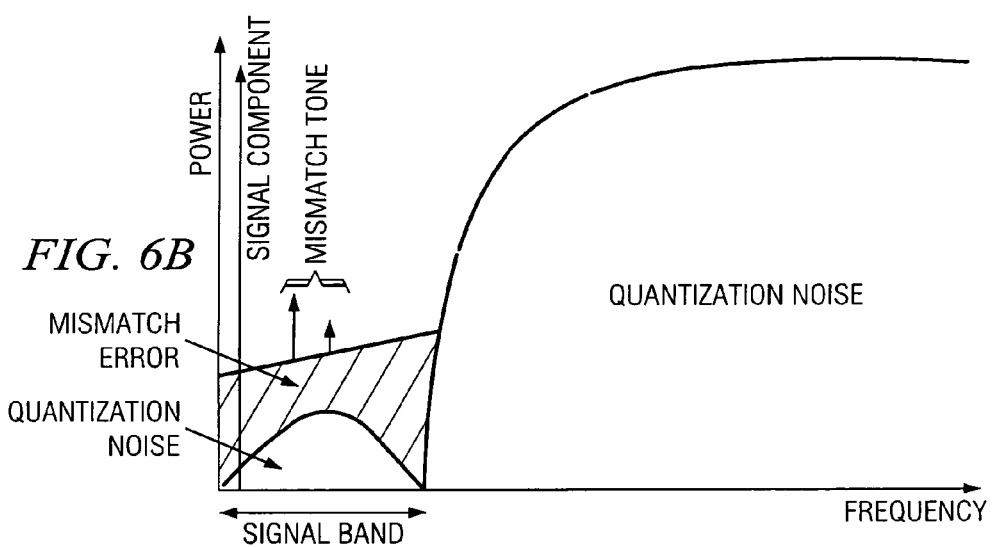
Figure 6C:
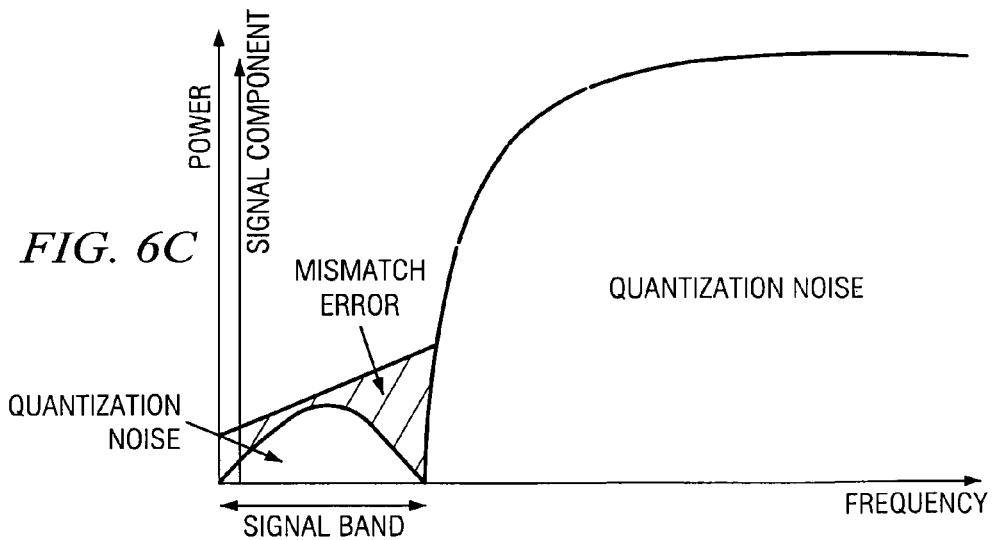

FIG. 4 is a block diagram illustrating the basic constitution of an oversampling type digital-to-analog converter using a ΔΣ modulator. Also, FIGS. 6(A)–6(C) are schematic diagrams illustrating the state of noise suppression in this constitution. The abscissa represents frequency, and the ordinate the signal or noise power. FIG. 6(A) shows the case when there is no DEM. FIG. 6(B) shows the case of the primary mismatch reduction constitution. FIG. 6(C) shows the case of the secondary mismatch reduction constitution.

The digital-to-analog converter shown in the figure comprises the following parts: interpolator, ΔΣ modulator 10, thermometer encoder 11, DEM processing means 12, N 1-bit type digital-to-analog converters (1 bit DAC) (13-1), (13-2) . . . (13-(N-1)), (13-N) of said elements as factors in generating matching error, adder 14, and low-pass filter 15.

In the oversampling type digital-to-analog converter using said ΔΣ modulator, the oversampling operation is performed by means of said interpolator using, for example, DSP (decimal Signal Processor) or other microprocessor.

The oversampled data is the input to said ΔΣ modulator. For example, the ΔΣ modulation may be performed using DSP (decimal Signal Processor) or the like. As shown in FIG. 5, the quantization noise generated in quantizer 32 in ΔΣ modulator 10 is shifted to the higher-frequency region by means of loop filter 31. As a result, as shown in FIG. 6(A), the quantization noise in the signal band is reduced. The output of the quantizer is multibit digital signal IN0 with binary weight, and it is transferred to thermometer encoder 11 of the next stage. Also, in FIG. 5, 33 represents a subtractor.

Figure 7:
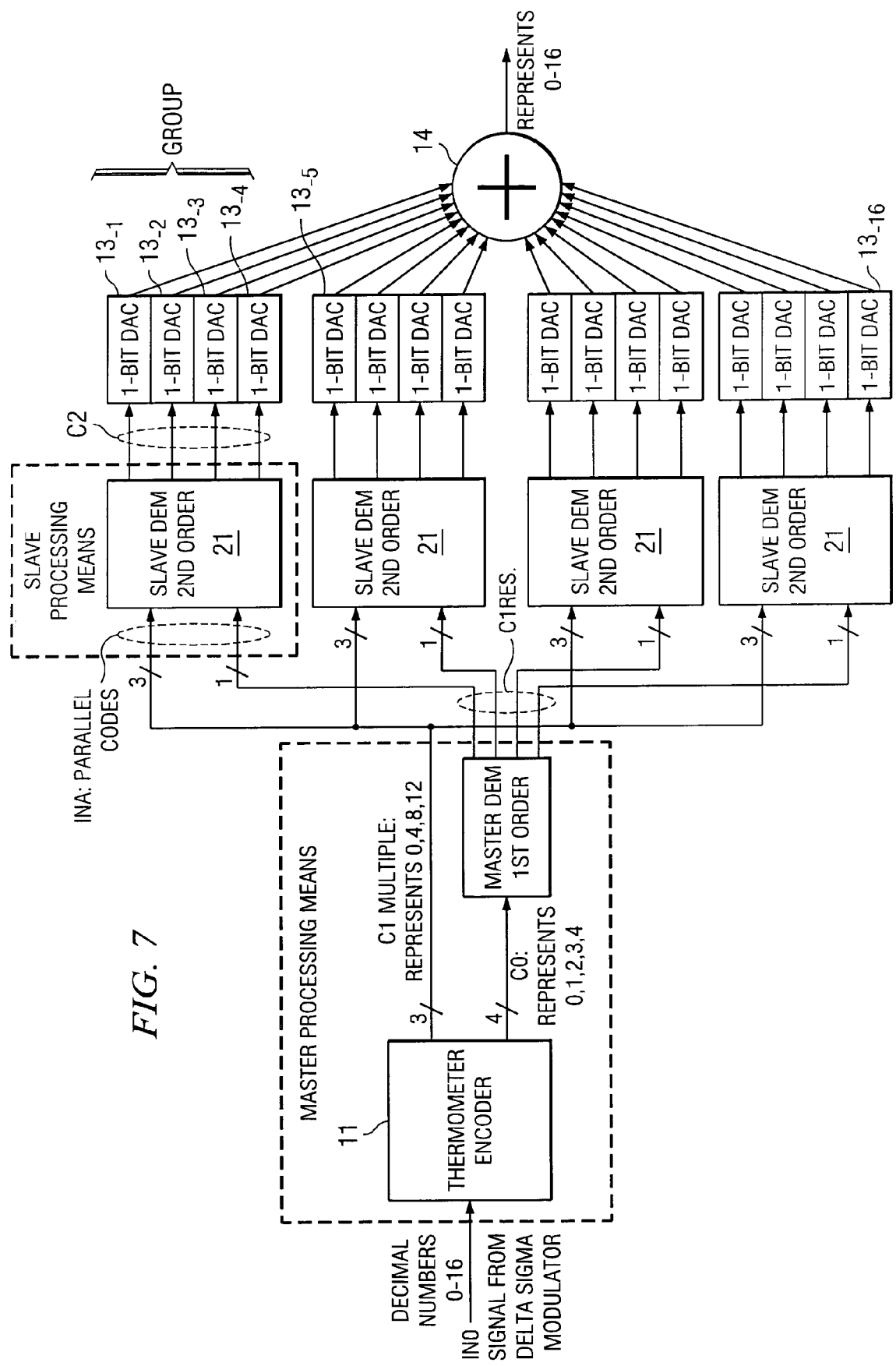
FIG. 7 is a block diagram illustrating an assembly example from the thermometer encoder to the adder.

FIG. 7 is a diagram illustrating an example of assembly from said thermometer encoder 11 to adder 14.

FIG. 7 is a diagram illustrating the constitution of DEM processing means 12 in FIG. 4 composed of master DEM means 20 and four slave DEM means 21. As the scheme in dividing the function of the digital encoder in the embodiment shown in FIG. 1, there are "master processing means" and "slave processing means." Here, as shown in FIG. 7, thermometer encoder 11 and master DEM means 20 belong to the "master processing means," while individual slave DEM means 21 belong to the "slave processing means."

In this assembly example, thermometer encoder 11 has the function of converting binary weight input signal IN0 into the thermometer code, and a function which performs division corresponding to dividing the input signal value (decimal number) by the number of slave processing means, "4," and converts the input signal value to remainder code C0 that indicates the remainder code and multiple code C1 multiple that indicates the multiple value of N to be given commonly to a plurality of slave processing means. This function is an embodiment of the function of "input conversion means" of the present invention. Also, thermometer encoder 11 has the shift register function that shifts the division result by 2 bits when multiple code C1 multiple indicating the multiple value of N is determined.

Remainder code C0 includes four parallel codes representing the input signal values (decimal numbers) of "0," "1," "2," "3," respectively. On the other hand, multiple code C1 multiple includes three parallel codes representing the input signal values (decimal numbers) of "4," "8," "12," respectively.

Said remainder code C0 is input to master DEM means 20, and multiple code C1multiple is input in parallel to four slave processing means 21.

Also, when input signal IN0 is "16" (decimal number), thermometer encoder 11 performs exceptional treatment, outputs "4" to remainder code C0, and outputs "12" to multiple code C1 multiple. With this operation, an output corresponding to any of the input signal values (decimal numbers) from "0" to "16" can be generated.

Master DEM means 20 encodes input remainder code C0 into parallel codes C1res., and it assigns each code to four slave DEM parts 21.

Multiple code C1 multiple from thermometer encoder 11 and one parallel code C1 from master DEM means 20 are input to slave DEM means 21 in parallel. Multiple code C1 multiple and parallel codes C1res. form parallel code C1. The parallel codes input to various slave DEM means 21 will be denoted as "INA" hereinafter (see FIG. 6). Slave DEM means 21 encodes 4-value parallel code INA into 4-value parallel code C2, and outputs it to 1-bit type digital-to-analog conversion parts belonging to the corresponding group, one code at a time.

Master DEM means 20 and slave DEM means 21 assign the input four codes to four output nodes, respectively, on the basis of the intrinsic DEM algorithm. The algorithm may be of any type. For example, in one method, the codes indicating binary values are simply randomized. In another method, a code pattern with a configuration unlike any thus far discussed with respect to the output nodes is obtained with reference to the history information.

FIG. 8 illustrates an example of the constitution of the DEM part when the DEM algorithm is used with reference to the history information. It shows the basic concept of this constitution. FIG. 8(A) shows the primary mismatch reduction constitution (master DEM means in this example), and FIG. 8(B) shows the secondary mismatch reduction constitution (slave DEM means in this example).

Master DEM means 20 with the primary mismatch reduction constitution shown in FIG. 8(A) has so-called vector quantizer (VQ) 22, integrator (23A) and bit inverter 24.

Parallel codes INA are input side by side to vector quantizer 22 and output. In this case, the rule for inputting them side by side is determined with reference to four control parallel codes INB input to the control input. Control parallel codes INB are stored for only one input signal processing time with an integrator after bit inversion of output parallel codes C1res. that are output after conversion to the side-by-side state. The stored codes are then read out and used as control parallel codes INB in the next input signal processing operation.

With this constitution, parallel codes C1res. output during the last cycle of processing are inverted and their magnitudes compared. With the results used as a reference, active code "1" that makes the 1-bit type digital-to-analog conversion part work is preferably assigned to the output node that output "0" during the last processing cycle. That is, with the history of each input signal used as a reference, the 1-bit type digital-to-analog conversion part that did not operate during the last cycle is preferably made operative. As a result, the 1-bit DAC that was enabled during the last cycle is disabled during the present cycle, if possible.

Another integrator (23B) is added to the constitution shown in FIG. 8(A) to form slave DEM means 21 with the secondary mismatch reduction constitution shown in FIG.

8(B). Two integrators (23A) and (23B) are coupled in series, and the output of integrator (23B) is coupled via coefficient amplifier (25B) to one of the inputs of adder 26. The output of integrator (23A) is coupled via another coefficient amplifier (25A) to the other input of adder 26. The output of adder 26 is input as control parallel codes INB to vector quantizer 22.

In this constitution, the history information from the last cycle and penultimate processing cycle are used as references. The weights given to the history information of the two processing cycles are determined by the gain ratio of coefficient amplifiers (25A) and (25B). The values of control parallel codes INB with the primary mismatch reduction constitution are only "1" and "0." Consequently, the precision in determining the priority order tends to become relatively lower. However, because the secondary mismatch reduction constitution uses the weight values of the history information of the last and penultimate cycle, the values have greater variety, and it is possible to determine the priority more precisely.

Also, in this constitution, oscillation is prevented with a feed-forward loop through coefficient amplifier 25, so that the operation becomes more stable.

With such a secondary mismatch reduction constitution, the referenced history information has a broader range than that in the primary mismatch reduction constitution, and the precision is greater. Consequently, as can be seen from the comparison between FIG. 6(B) and FIG. 6(C), mismatch tones due to manufacturing variations, etc. between the elements, especially the analog elements, of the 1-bit type digital-to-analog conversion part can be suppressed, so that the constitution exhibits even greater mismatch reduction. Also, in this case, it is possible to optimize the mismatch reduction performance by optimizing the gain ratio.

The secondary mismatch reduction constitution uses two integrators (23A) and (23B), and it also includes adder 26, coefficient amplifiers (25A), (25B), and other constitutional features that have been added to the primary mismatch reduction constitution. Each integrator (23A) and (23B) uses a constitution that stores and reads the data in the memory, and the assembly area tends to become larger. Consequently, the secondary mismatch reduction constitution has excellent performance, but a larger assembly area than that of the primary mismatch reduction constitution.

On the other hand, the primary mismatch reduction constitution only requires storage of the inversion information of the last cycle. Consequently, the generation of parallel control codes INB can be realized with a simple shift operation, and the assembly area becomes much smaller.

Also, the number of 1-bit type digital-to-analog conversion parts in each group of the latter section is also closely relating to the area of the mismatch reduction constitution. When said number is smaller, the memory capacity of integrators (23A), (23B) becomes lower, and in vector quantizer 22, the constitution for setting the control code values side by side for comparison of magnitudes to determine the priority order can be made simpler. Consequently, the assembly area of the mismatch reduction constitution can be reduced.

In addition, since the number of the 1-bit type digital-to-analog conversion parts in each group of the latter section is reduced, it becomes easier to make the average duty ratio uniform. In this sense, the mismatch reduction performance is also improved.

In this embodiment, as shown in FIG. 4, 1-bit type digital-to-analog conversion parts DAC (13-1)-(13-N) operate only when the input is "1." In this case, they output analog current or voltage, and the N DAC outputs are added at adder 14, to produce analog output y[N], which is input to low-pass filter 15, which outputs analog signal OUT with the broadband noise component removed.

The variations in assembly examples will be explained below.

As shown in FIG. 7, with thermometer encoder 11, the function of the thermometer encoding can be realized in the input section of each slave processing means.

Also, the function of bit shift when multiple code C1 multiple is generated may also be set in the input section of each slave processing means.

In addition, in this assembly example, master DEM means 20 controls the assignment of remainder code C0 for each slave processing means on the basis of the DEM method. However, in this case, the value of the remainder changes frequently, and the randomness becomes more significant than the multiple value displayed by multiple code C1 multiple. Also, DEM processing is performed again with the slave DEM for the remainder value. Consequently, it is possible to omit master DEM means 20 itself. In this way, there is no significant degradation in the mismatch reduction performance. In this case, the master processing function includes only the function with which the input signal value is divided into the remainder value and a multiple value of N and the function of thermometer encoding.

The function of digital encoder from thermometer encoder 11 to slave DEM means 21 as shown in FIG. 7 can be partially or entirely replaced with a programmable processor. More specifically, for example, it is possible to execute some or all of said functions of $\Delta\Sigma$ modulator 10 in the last section with a DSP. In particular, the function of thermometer encoder 11 shown in FIG. 6 can be handled by a DSP quite easily. Also, because the processing sequence performed by master DEM means 20 and slave DEM means 21 is a collection of comparison, delay and memory processing sequences, digital processing can be performed with a DSP, and it is possible to switch to its program sequence.

That is, the "master processing means," "slave processing means," "master DEM means," "slave DEM means," and/or "input conversion means" may be replaced with program sequences that can be executed by a DSP or other processor. In addition, in the present invention, when the processing performed by DEM means is replaced with the program processing sequence, instead of focusing on the assembly area, the effect of relaxing the tradeoff between processing efficiency and mismatch reduction performance comes to the forefront of the present invention.

While the invention has been shown and described with reference to preferred embodiments thereof, it is well understood by those skilled in the art that various changes and modifications can be made in the invention without departing from the spirit and scope of the invention as defined by the appended claims.

The invention claimed is:

1. A digital encoder comprising:
    a master processing means that encodes a multibit digital input signal into prescribed parallel codes;
    and a plurality of slave processing means, each of which has 3 or more output nodes, encodes the codes output in parallel from said master processing means into parallel codes corresponding to the configuration of said 3 or more output nodes and with the same weighting for all of the codes on the basis of a prescribed dynamic element matching algorithm, and outputs said parallel codes in parallel from 3 or more output nodes, wherein the encoding of the multibit digital input signal in said master processing means into the aforementioned parallel codes is performed corresponding to the configuration of the plurality of output nodes on the basis of a prescribed dynamic element matching algorithm; and, wherein said master processing means comprises:

an input conversion means, which computes a remainder code that shows the remainder value indicating the remainder obtained when the value of said input signal is divided by N, the number of the slave processing means, and the multiple code that is commonly given to a plurality of slave processing means so as to enable representation of the multiple value of N, and which converts said input signal into said remainder code and said multiple code, and a master DEM means, which takes said remainder code output from said input conversion means as input, and which encodes said remainder code into parallel codes corresponding to the configuration of the plurality of output nodes on the basis of a prescribed dynamic element matching algorithm;

and said slave processing means has a slave DEM means, which takes said multiple code output from said input conversion means and the parallel codes output from said master DEM means as input, and which performs encoding on the basis of a prescribed dynamic element matching algorithm.

2. The digital encoder of claim 1, wherein the number of said slave DEM means is chosen as a power of two.

3. The digital encoder of claim 2, wherein said input conversion means contains a means that performs bit shifting of said multiple code and outputs said multiple value of N.

4. The digital encoder of claim 3, further comprising has a thermometer encoder that performs the following operation: for at least the remainder code of said remainder code and said multiple code, on the path from input of said input signal to input to said slave DEM means, the signal on said path is converted into the thermometer code.

5. The digital encoder of claim 2, wherein each input section of said slave processing means contains a means that performs bit shifting of said multiple code and outputs said multiple value of N.

6. The digital encoder of claim 2, further comprising has a thermometer encoder that performs the following operation: for at least the remainder code of said remainder code and said multiple code, on the path from input of said input signal to input to said slave DEM means, the signal on said path is converted into the thermometer code.

7. The digital encoder of claim 1, further comprising a thermometer encoder that performs the following operation: for at least the remainder code of said remainder code and said multiple code, on the path from input of said input signal to input to said slave DEM means, the signal on said path is converted into the thermometer code.

8. A digital-to-analog converter further comprising:

a digital encoder, which encodes a digital input signal to a code column with the same weighting for all of the codes and which outputs the codes in parallel from a plurality of output nodes, and a plurality of 1-bit type digital-to-analog conversion parts into which are respectively input the codes output in parallel from said digital encoder:

said digital encoder has a master processing means that encodes said input signal into parallel codes corresponding to the configuration of the plurality of output nodes on the basis of a prescribed dynamic element matching algorithm;

and a plurality of slave processing means, each of which has 3 or more output nodes, encodes the codes output in parallel from said master processing means into parallel codes corresponding to the configuration of said 3 or more output nodes and with the same weighting for all of the codes on the basis of a prescribed dynamic element matching algorithm, and outputs said parallel codes in parallel from 3 or more output nodes to said plurality of 1-bit type digital-to-analog conversion parts; and, wherein said master processing means comprises:

an input conversion means, which computes a remainder code that indicates the remainder value indicating the remainder obtained when the value of said input signal is divided by N, the number of the slave processing means, and the multiple code that is commonly given to plural slave processing means so as to enable representation of the multiple value of N, and which converts said input signal into said remainder code and said multiple code, and a master DEM means, which takes said remainder code output from said input conversion means as input, and which encodes said remainder code into parallel codes corresponding to the configuration of the plurality of output nodes on the basis of a prescribed dynamic element matching algorithm;

and said slave processing means comprises a slave DEM means, which takes said multiple code output from said input conversion means and the parallel codes output from said master DEM means as inputs, and which performs encoding on the basis of a prescribed dynamic element matching algorithm.

9. The digital-to-analog converter of claim 8, wherein the number of said slave DEM means is chosen as a power of two.

10. The digital-to-analog converter of claim 9, wherein said input conversion means contains a means that performs bit shifting of said multiple code and outputs said multiple value of N.

11. The digital-to-analog converter of claim 9, wherein each input section of said slave processing means contains a means that performs bit shifting of said multiple code and outputs said multiple value of N.

12. The digital-to-analog converter of claim 8, further comprising a thermometer encoder that performs the following operation: for at least the remainder code of said remainder code and said multiple code, on the path from input of said input signal to input to said slave DEM means, the signal on said path is converted into the thermometer code.

13. A digital-to-analog converter comprising:

a first processor that encodes a multibit digital signal to a first code column corresponding to the first configuration on the basis of a first dynamic element matching algorithm, a plurality of second processors that encode the codes of said first code column into a second code column, which has the same weighting for all of the codes and corresponds to the second configuration, on the basis of a second dynamic element matching algorithm, a plurality of 1-bit type digital-to-analog converters that take the codes of said second code columns as inputs, respectively;

and an adder means that adds the outputs of said plurality of 1-bit type digital-to-analog converters; wherein said first dynamic element matching algorithm is realized by a primary mismatch reduction constitution, and said second dynamic element matching algorithm is realized by a secondary mismatch reduction constitution, said first dynamic element matching algorithm and said second dynamic element matching algorithm are realized by the secondary mismatch reduction constitution; and, wherein said first processor comprises:

a converter, which computes the remainder code that indicates the remainder value indicating the remainder obtained when said digital signal is divided by N, the number of said second processors, and the multiple code that indicates said multiple value of N corresponding to the quotient of said division operation, and which converts said digital signal into said remainder code and said multiple code, and a first DEM circuit that takes said remainder code as input and encodes said remainder code to a code column corresponding to a prescribed configuration on the basis of said first dynamic element matching algorithm;

and said second processor has a second DEM circuit, which takes said multiple code and the encoding result of said first DEM circuit as input, and which performs encoding on the basis of said second dynamic element matching algorithm.

14. The digital-to-analog converter of claim 13, wherein said first dynamic element matching algorithm is realized by the primary mismatch reduction constitution, and said second dynamic element matching algorithm is realized by means of the secondary mismatch reduction constitution.

* * * * *